United States Patent
Yumoto et al.

(10) Patent No.: US 8,405,995 B2
(45) Date of Patent: Mar. 26, 2013

(54) SEMICONDUCTOR DEVICE

(75) Inventors: Shuji Yumoto, Aichi-ken (JP); Shintaro Watanabe, Aichi-ken (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 342 days.

(21) Appl. No.: 12/596,338

(22) PCT Filed: Apr. 18, 2008

(86) PCT No.: PCT/JP2008/057617
§ 371 (c)(1),
(2), (4) Date: Oct. 16, 2009

(87) PCT Pub. No.: WO2008/133210
PCT Pub. Date: Nov. 6, 2008

(65) Prior Publication Data
US 2010/0110638 A1    May 6, 2010

(30) Foreign Application Priority Data

Apr. 19, 2007  (JP) .................. 2007-110726

(51) Int. Cl.
*H05K 7/20* (2006.01)
(52) U.S. Cl. ...................................... 361/709
(58) Field of Classification Search .................. 361/709, 361/696–700, 704, 719–720; 174/15.2, 16.3, 174/252, 262
See application file for complete search history.

(56) References Cited

U.S. PATENT DOCUMENTS

| | | |
|---|---|---|
| 2003/0196780 A1 | 10/2003 | Hegde |
| 2004/0120096 A1 | 6/2004 | Apfelbacher et al. |
| 2005/0151555 A1* | 7/2005 | Lewis et al. .................. 324/760 |
| 2006/0192253 A1 | 8/2006 | Okumura et al. |
| 2006/0209516 A1 | 9/2006 | Chengalva et al. |

FOREIGN PATENT DOCUMENTS

| | | |
|---|---|---|
| EP | 1 357 592 A2 | 10/2003 |
| EP | 1 357 592 A3 | 4/2005 |
| EP | 1 703 557 A2 | 9/2006 |
| EP | 1 703 557 A3 | 8/2009 |
| JP | 57-66545 U | 4/1982 |
| JP | 2002-270765 A | 9/2002 |
| JP | 2006-237429 A | 9/2006 |

OTHER PUBLICATIONS

International Search Report issued on Jul. 29, 2008, for international application No. PCT/JP2008/057617.
Extended European search report for Application No. PCT/JP2008/057617, dated Apr. 27, 2010.
International Preliminary Report on Patentability for the corresponding PCT Application No. PCT/JP2008/057617.

* cited by examiner

*Primary Examiner* — Timothy J Thompson
*Assistant Examiner* — Tremesha S Willis
(74) *Attorney, Agent, or Firm* — Locke Lord LLP

(57) ABSTRACT

A semiconductor module mounted on a vehicle is disclosed. The semiconductor module includes a semiconductor element, a forced-cooling type cooler, and a heat mass. Heat generated in the semiconductor element is conducted to the cooler. The heat mass is joined onto the semiconductor element, so as to be thermally coupled to the semiconductor element. The heat mass is formed such that the thermal resistance of a part of the heat mass that corresponds to a high temperature part of the semiconductor element in a heat generating state is lower than the thermal resistance of a part of the heat mass that corresponds to a lower temperature part of the semiconductor element.

6 Claims, 7 Drawing Sheets

Fig.8
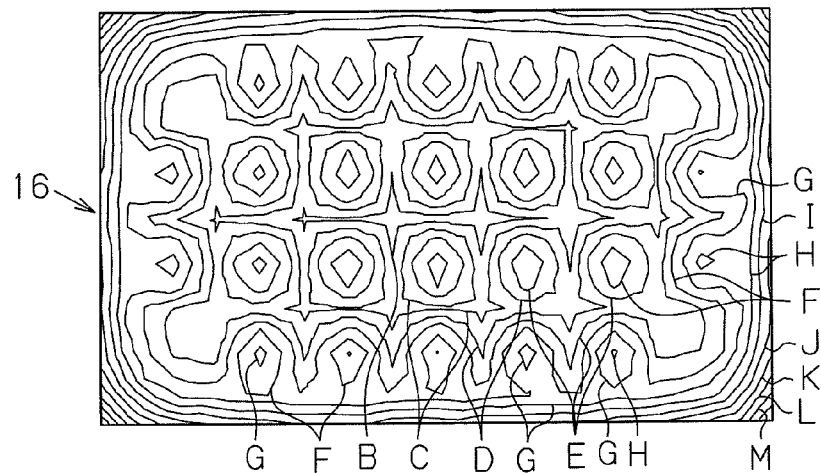
Fig.9(a) Fig.9(b) Fig.9(c)
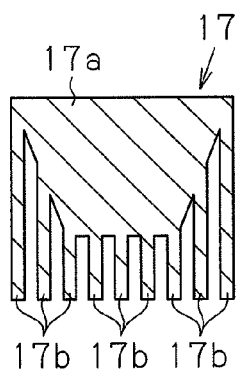 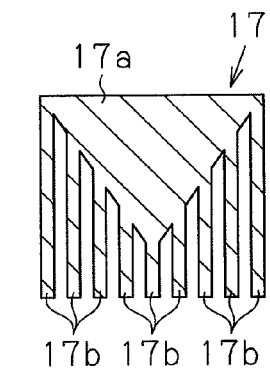 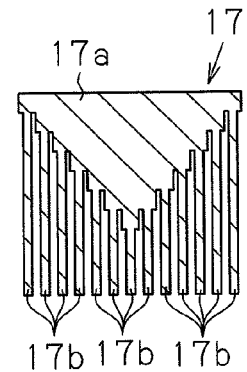
Fig.10(a) Fig.10(b) Fig.10(c)
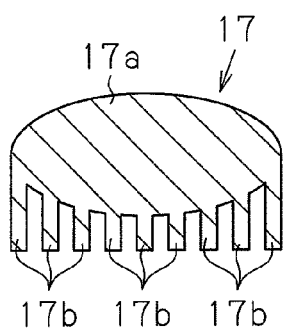 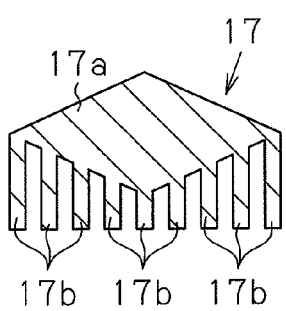 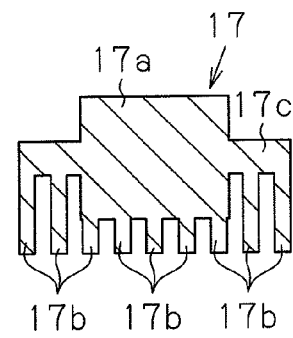

Fig.11 (a)  Fig.11 (b)  Fig.11 (c)
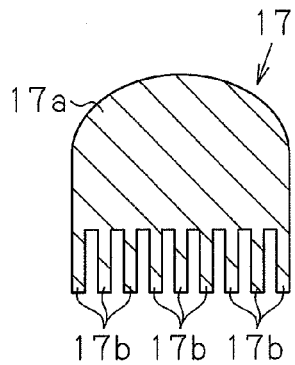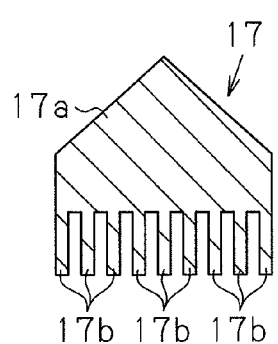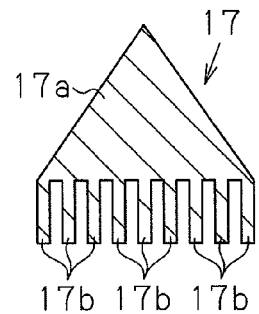
Fig.11 (d)  Fig.11 (e)
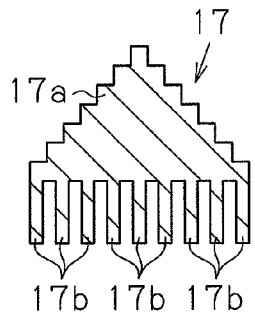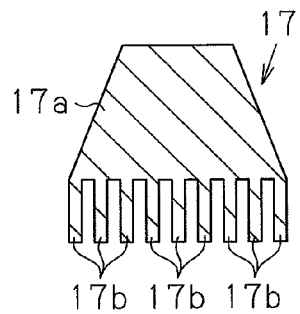
Fig.12 (a)  Fig.12 (b)  Fig.12 (c)
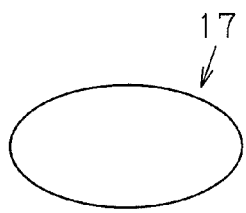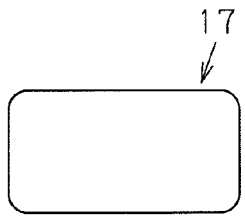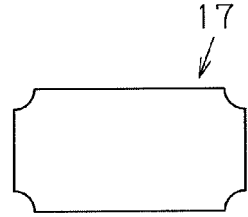
Fig.12 (d)  Fig.12 (e)  Fig.12 (f)
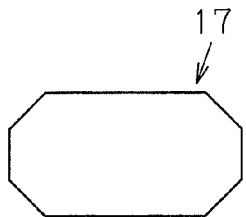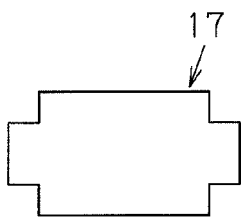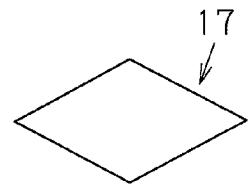

Fig.13(a)  Fig.13(b)
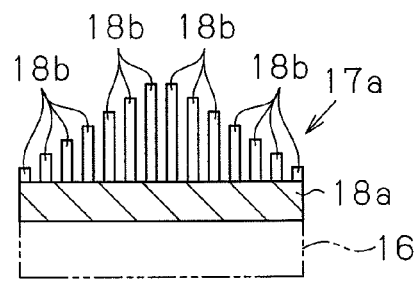 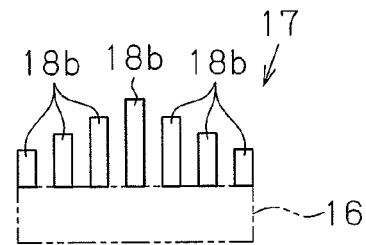
Fig.14(a)  Fig.14(b)  Fig.14(c)
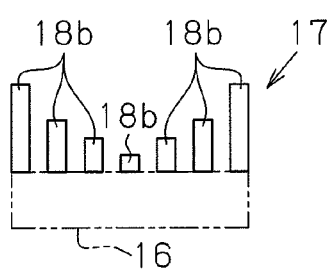 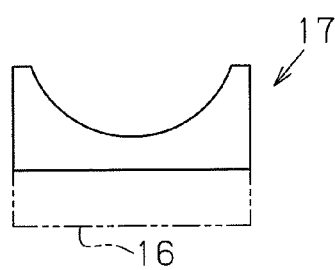 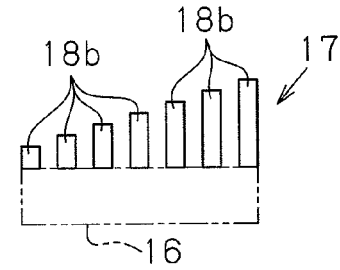
Fig.14(d)  Fig.14(e)
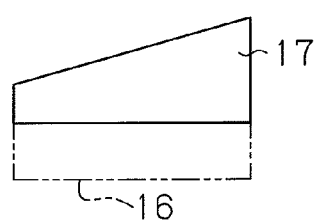 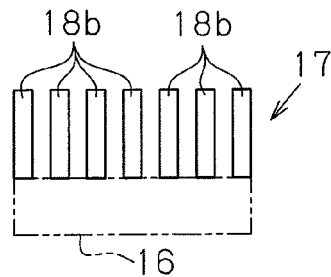

Prior Art

SEMICONDUCTOR DEVICE

FIELD OF THE INVENTION

The present invention relates to a semiconductor device that includes a semiconductor element joined onto a circuit board having a cooler of forced-cooling type.

BACKGROUND OF THE INVENTION

Semiconductor devices have been known that have a heat sink, a substrate laminated on and adhered to the heat sink, and a semiconductor element mounted on the circuit pattern of the substrate. Heat generated in the semiconductor element is radiated by being conducted to the heat sink from the lower surface of the semiconductor element via the substrate. In such a semiconductor device, the heat sink needs to produce a cooling effect required when the semiconductor element transiently produces a large amount of heat due to overload. However, if the cooling capacity of the heat sink is determined on the basis of the state where the semiconductor element transiently produces a large amount of heat due to overload, the size of the semiconductor device will be increased.

Patent Document 1 discloses a semiconductor module having a semiconductor element used in a power converter. The semiconductor module inhibits sharp increase in the temperature of the semiconductor element due to overload. As shown in FIG. 16(a), a semiconductor module 51 includes a semiconductor element 54 and a heat accumulators 55 provided directly above and in the vicinity of the semiconductor element 54. The semiconductor element 54 is located on a metal substrate 52 with an insulation substrate 53 in between. The heat accumulators 55 change from the solid phase to the liquid phase at a temperature slightly lower than the upper limit of a usable temperature range of the semiconductor element 54, thereby temporarily absorbing the heat of the semiconductor element 54 and radiates the heat. The heat produced in the semiconductor element 54 is conducted to a cooler (not shown) through the metal substrate 52. However, when the cooling capacity of the cooler is insufficient in an overload state, excessive heat is temporarily stored in the heat accumulator 55 before being conducted to the cooler.

Patent Document 2 discloses a semiconductor device that efficiently radiates heat generated in a semiconductor module, thereby reducing the thermal stress acting on joint interfaces in the module. In the semiconductor device, as shown in FIG. 16(b), copper foil sheets 61a, 61b are provided on an insulation substrate 61. The collector electrode of an IGBT 62 is welded to the insulation substrate 61. The emitter electrode of the IGBT 62 is welded to an electrode member 63. The electrode member 63 is formed of ceramics and includes a support 64 and copper posts 65. The support 64 has through holes 64a, which are arranged in a line. Each copper post 65 is embedded in one of the through holes 64a. A copper electrode 66 is welded to a surface of the electrode member 63 opposite to the IGBT 62.

The capacity of the cooler of the semiconductor module 51 disclosed in Patent Document 1 only needs to be sufficient to cope with a non-overload state, that is, with heating of the semiconductor element 54 in a normal state. It is thus possible to inhibit the size of the device from increasing. The temperature distribution of the semiconductor element 54 in a heat generating state is not uniform, and the temperature varies depending on the position. Typically, the temperature of the semiconductor element 54 is high in a central part and decreases toward the periphery. However, Patent Document 1 does not address the uneven temperature distribution of the semiconductor element 54 in a heat generating state. Also, Patent Document 1 does not specify whether the heat accumulator 55 itself is formed of a substance that changes between the solid phase and the liquid phase, or the heat accumulator 55 has in it a substance that changes between the solid phase and the liquid phase. In the case where the heat accumulator 55 itself is formed of a substance that changes between the solid phase and the liquid phase, if the semiconductor module 51 is vibrated or inclined when the heat accumulator 55 is in the liquid phase, the heat accumulator 55 is displaced from a predetermined position. Therefore, the heat accumulator 55 is not suitable for the use in a vehicle or in a vibrating state.

Patent Document 2 has no description of a configuration for having the copper electrode 66 function as a heat mass that temporarily stores heat and then radiate the heat in an overload state. Naturally, Patent Document 2 gives no consideration to a method for having a heat mass more properly function to deal with the fact that the temperature distribution of the semiconductor element (IGBT 62) is uneven in a heat generating state.

Patent Document 1: Japanese Laid-Open Patent Publication No. 2002-270765
Patent Document 2: Japanese Laid-Open Patent Publication No. 2006-237429

SUMMARY OF THE INVENTION

Accordingly, it is an objective of the present invention to provide a semiconductor device having a heat mass that inhibits sharp increase in the temperature of a semiconductor element and can be formed with less amount of material without reducing the capacity.

To achieve the foregoing objective and in accordance with one aspect of the present invention, a semiconductor device having a semiconductor element, a forced-cooling type cooler, and a heat mass is provided. Heat generated in the semiconductor element is conducted to the cooler. The heat mass is joined onto the semiconductor element, so as to be thermally coupled to the semiconductor element. The heat mass is formed such that the thermal resistance of a part of the heat mass that corresponds to a high temperature part of the semiconductor element in a heat generating state is lower than the thermal resistance of a part of the heat mass that corresponds to a lower temperature part of the semiconductor element.

BRIEF DESCRIPTION OF THE DRAWINGS

FIG. 8 is a diagram showing the temperature distribution of the semiconductor element with a heat mass having no legs in the four corners;

FIGS. 9(a) to 9(c) are schematic cross-sectional views showing heat masses of modifications;

FIGS. 10(a) to 10(c) are schematic cross-sectional views showing heat masses of modifications;

FIGS. 11(a) to 11(e) are schematic cross-sectional views showing heat masses of modifications;

FIGS. 12(a) to 12(f) are schematic plan views showing heat masses of modifications;

FIGS. 13(a) and 13(b) are diagrams showing heat masses of modifications;

FIGS. 14(a) to 14(e) are diagrams showing heat masses of modifications;

DETAILED DESCRIPTION OF THE PREFERRED EMBODIMENTS

Figure 1:
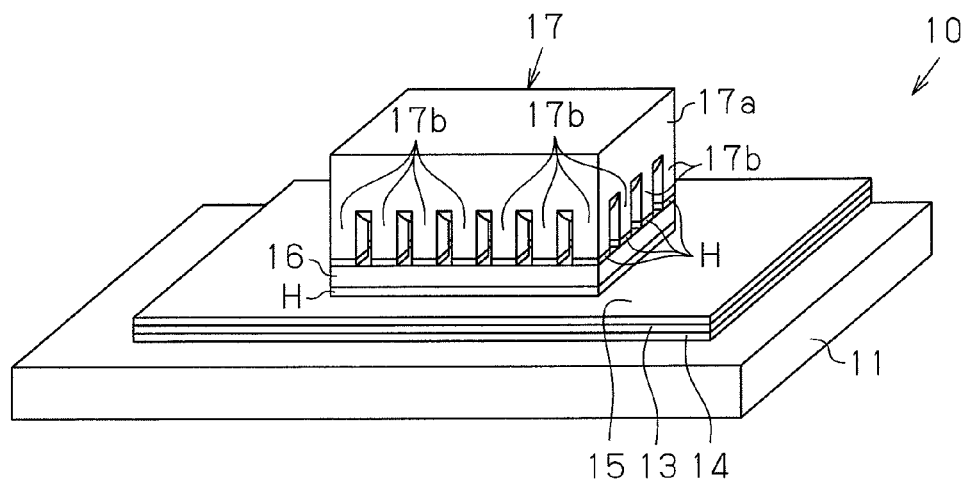
FIG. 1 is a perspective view illustrating a semiconductor device according to a first embodiment of the present invention.

FIGS. 1 to 6 show a semiconductor device 10 according to a first embodiment of the present invention. The semiconductor device 10, which is a semiconductor module, is mounted on a vehicle. Each of the FIGS. 1 and 2 schematically shows the structure of the semiconductor device 10. For the illustrative purposes, the dimensions of some of the elements are exaggerated. That is, the ratios of the widths, lengths, and thicknesses of some of the elements of the semiconductor device 10 in the drawings are not to scale.

As shown in FIGS. 1 and 2, the semiconductor device 10 includes a forced-cooling type cooler 11. The "forced-cooling" in this description includes a cooling method in which a cooling medium is supplied from the outside and a cooling method such as ebullient cooling in which the phase of cooling medium is changed in the order of the liquid phase, the vapor phase, and the liquid phase so that the cooling medium circulate naturally. In the present embodiment, a cooling method in which cooling medium is supplied from the outside to the cooler 11 is employed. The cooler 11 has a flat and rectangular box. As shown in FIG. 2, the cooler 11 has a cooling medium passage 12, through which cooling medium flows. A ceramic substrate 13 is joined to the cooler 11 with a metal layer 14 in between. A metal wiring layer 15 is formed on the ceramic substrate 13, and a semiconductor element 16 is joined onto the metal wiring layer 15.

The cooling capacity of the cooler 11 is set such that, when the semiconductor element 16 is steadily generating heat, that is, when the semiconductor element 16 is in a normal state, the heat generated in the semiconductor element 16 is conducted to the cooler 11 via the ceramic substrate 13, and as a result, the heat is smoothly removed from the semiconductor element 16. The cooler 11 is formed of aluminum-based metal. The aluminum-based metal refers to aluminum or an aluminum alloy. The metal layer 14 functions as a joining layer for joining the cooler 11 to the ceramic substrate 13, and is formed, for example, of aluminum. The cooling medium passage 12 has an inlet and an outlet (neither is shown), which are connectable to a cooling medium circuit mounted on the vehicle. Although a number of ceramic substrates 13 are joined to the cooler 11, only one ceramic substrate 13 is shown in FIGS. 1 and 2 for the illustrative purposes. The semiconductor element 16 is one of an IGBT (Insulated Gate Bipolar Transistor), a MOSFET, and a diode.

The ceramic substrate 13 is formed of, for example, aluminum nitride. The metal wiring layer 15 is formed, for example, of aluminum. The metal layer 14 and the metal wiring layer 15 are formed by brazing aluminum plates to the ceramic substrate 13 using aluminum based brazing filler metal. The thickness of the ceramic substrate 13 is preferably in the range from 0.1 mm to 1 mm. The thickness of the metal layer 14 and the thickness of the metal wiring layer 15 are preferably in the range from 0.1 mm to 1 mm, and more preferably are about 0.6 mm.

A heat mass 17 is joined to the semiconductor element 16 with solder H. The heat mass 17 temporarily absorbs heat generated in the semiconductor element 16, and then radiates the heat. That is, the heat mass 17 of the semiconductor device 10 is arranged on the semiconductor element 16 and is thermally coupled to the semiconductor element 16 with the solder H. The "heat mass" is a member that is thermally coupled to the semiconductor element 16 and has such a predetermined heat capacity that, when the temperature of the semiconductor element 16 is higher than the temperature of the heat mass, the heat mass receives, or absorbs, the heat of the semiconductor element 16.

When in an overload state, the semiconductor element 16 generates heat greater than heat generated in the steady heat generating state, the cooler 11 may fail to sufficiently cool the semiconductor element 16. In such a case, part of the heat generated in the semiconductor element 16 is temporarily absorbed by the heat mass 17, so that the semiconductor element 16 is inhibited from being overheated. The heat capacity of the heat mass 17 is set to such a value that overheated state of the semiconductor element 16 is inhibited. For example, in the case where the semiconductor device 10 is used as an inverter that controls the drive motor of a hybrid vehicle, if the vehicle is abruptly accelerated or stopped from a steady operation, the generation of heat in the semiconductor element 16 causes heat loss that is three to five times greater than the rated heat loss in a short period, which is less than one second. The heat capacity of the heat mass 17 of the present embodiment is determined such that the temperature of the semiconductor element 16 does not surpass the upper limit of the operational temperature range even in such a case. The reason why an excessive heat loss is generated from the semiconductor element 16 when the vehicle is abruptly stopped is that the regenerative operation of the drive motor causes a great current to flow through the semiconductor element 16.

The heat mass 17 is formed such that the thermal resistance of a part of the heat mass 17 that corresponds to a high temperature part of the semiconductor element 16 in a heat generating state is lower than the thermal resistance of a part of the heat mass 17 that corresponds to a low temperature part of the semiconductor element 16. In the present embodiment, the heat capacity of the part of the heat mass 17 that corresponds to the high temperature part of the semiconductor element 16 in a heat generating state is greater than the heat capacity of the part of the heat mass 17 that corresponds to the low temperature part of the semiconductor element 16. The "thermal resistance" represents how unlikely heat is conducted to the heat mass 17 away from the semiconductor element 16. A low thermal resistance represents a state in which heat is easily conducted away from the heat mass 17. In this manner, the heat mass 17 includes a low thermal resistance part (great heat capacity part), which corresponds to a high temperature part of the semiconductor element 16 in a heat generating state, and a high thermal resistance part (small heat capacity part), which corresponds to a low temperature part of the semiconductor element 16 in a heat generating state.

Figures 2A, 2B:
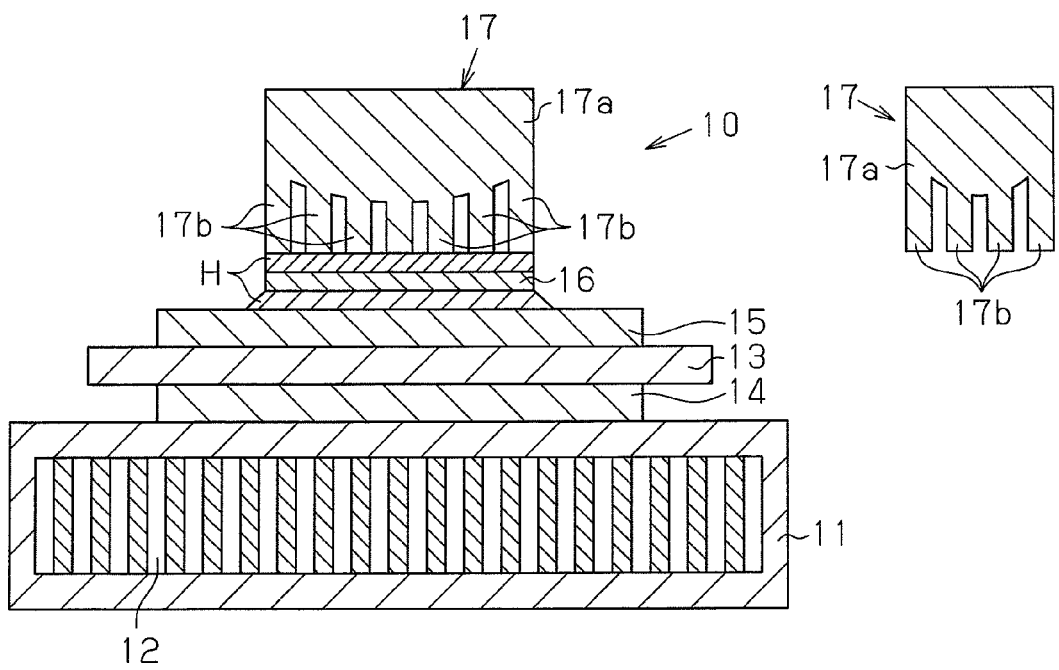
FIG. 2(a) is a schematic cross-sectional view showing the semiconductor device.
FIG. 2(b) is a cross-sectional view of the heat mass shown in FIG. 2(a)

In the present embodiment, the semiconductor element 16 has a temperature distribution described below when in a heat generating state. That is, the temperature of the semiconductor element 16 in a heat generating state is high in a central part of the semiconductor element 16, and decreases toward the periphery of the semiconductor element 16. As shown in FIGS. 2(a) and 2(b), the heat mass 17 has a main body 17a and a plurality of legs 17b, which are projections. In the main body 17a, the thickness of a part of a large heat capacity (great heat capacity part) is greater than the thickness of a part of a small heat capacity (small heat capacity part). The legs 17b extend toward the semiconductor element 16 from a surface of the main body 17a that faces the semiconductor element 16. The distal end of each leg 17b is directly joined to the semiconductor element 16 by solder H. That is, the heat mass 17 is joined to the semiconductor element 16 by the solder H at the legs 17b each having a segmented joint surface.

The surface of the main body 17a on which the legs 17b are formed is formed like a dome, and gradually bulging from its periphery to the central part. The legs 17b are arranged at predetermined intervals (in the present embodiment, constant intervals) on the dome-shaped surface. Each leg 17b is joined to the semiconductor element 16 in a state facing the semiconductor element 16. Therefore, the projecting lengths of the legs 17b at the periphery (edge) of the heat mass 17 are longer than the projecting lengths of the legs 17b in the central part of the heat mass 17.

Next, a method for manufacturing the semiconductor device 10 will be described. First, a cooler 11 and a circuit substrate is prepared. The circuit substrate has a ceramic substrate 13, a metal layer 14 formed on a surface of the ceramic substrate 13, and a metal wiring layer 15 formed on the other surface of the ceramic substrate 13. The circuit substrate is formed, for example, in the following manner. That is, a DBA (Direct Brazed Aluminum) substrate including a ceramic substrate 13 with an aluminum layer on either surface is prepared. Each aluminum layer is etched to form the metal layer 14 and the metal wiring layer 15. The cooler 11 is formed, for example, through casting of aluminum by using a core that corresponds to the cooling medium passage 12. A joint surface of the cooler 11 to which the metal layer 14 is joined is polished to be flat.

Next, with the metal layer 14 facing the joint surface of the cooler 11, a sheet of brazing filler metal for connecting aluminum is placed between the cooler 11 and the metal layer 14. Then, the circuit substrate is placed on the cooler 11. As the brazing filler metal for connecting aluminum, an Al—Si based alloy is used, for example. The cooler 11 and the circuit substrate are temporarily fixed in this state. While applying load to the joint surface of the cooler 11 through the circuit substrate, the cooler 11 and the circuit substrate are heated to 570 to 600° C. in a vacuum atmosphere or an inert atmosphere, so that the cooler 11 and the metal layer 14 are brazed to each other. Then, the semiconductor element 16 is soldered to a predetermined position of the metal wiring layer 15. Also, a wiring portion (not shown) is provided on the cooler 11. The semiconductor element 16 and the wiring portion are connected to each other by wire bonding to complete the semiconductor device 10.

Next, operation of the semiconductor device 10 will now be described. The semiconductor device 10 of the present embodiment is mounted on a hybrid vehicle, and the cooler 11 is connected to a cooling medium circuit (not shown) of the vehicle through pipes. The cooling medium circuit has a pump and a radiator. The radiator has a fan that is driven by a cooling motor. The radiator thus has a superior radiation efficiency. The cooling medium is, for example, water.

When the semiconductor element 16 mounted on the semiconductor device 10 is actuated, heat is generated from the semiconductor element 16. During a steady operation of the vehicle, that is, during a steady heat generating state of the semiconductor element 16, the heat generated in the semiconductor element 16 is conducted to the cooler 11 via the solder H and the ceramic substrate 13. The heat conducted to the cooler 11 is then conducted to the cooling medium flowing through the cooling medium passage 12 and removed. That is, since the cooler 11 is forcibly cooled by the cooling medium flowing through the cooling medium passage 12, the temperature gradient of a transfer pathway of heat from the semiconductor element 16 to the cooler 11 is increased. This allows the heat generated in the semiconductor element 16 to be efficiently removed through the metal wiring layer 15, the ceramic substrate 13, and the metal layer 14.

When the vehicle is abruptly accelerated or stopped from a steady operation, the generation of heat in the semiconductor element 16 is steeply increased. This causes heat loss that is three to five times greater than the rated heat loss in a short period, which is less than one second. Such a high heat generating state in a nonsteady operation cannot be coped only with the forced cooling by the cooler 11. However, since the heat mass 17 is soldered to the semiconductor element 16 of the present embodiment, the amount of heat that cannot be removed by the cooler 11 is temporarily absorbed by the heat mass 17. When the vehicle returns to the steady operation, the heat of the heat mass 17 is conducted to the cooler 11 through the semiconductor element 16, the metal wiring layer 15, the ceramic substrate 13, and the metal layer 14, so that the heat mass 17 returns to the original state.

When the coefficient of thermal expansion of the semiconductor element 16 and that of the heat mass 17 are compared, the coefficient of thermal expansion of the heat mass 17 is greater than that of the semiconductor element 16. Therefore, when the heat mass 17 is joined to the semiconductor element 16 in the entirety of the surface that faces the semiconductor element 16, the stress that acts on the solder H between the heat mass 17 and the semiconductor element 16 is greater than that in the case where the heat mass 17 is joined to the semiconductor element 16 with a plurality of legs 17b. That is, since the heat mass 17 is joined to the semiconductor element 16 with a plurality of legs 17b in between using the solder H, the legs 17b reduces the stress acting on the solder H.

The advantages of the heat mass 17 will now be described with reference to simulation results.

Figure 3:
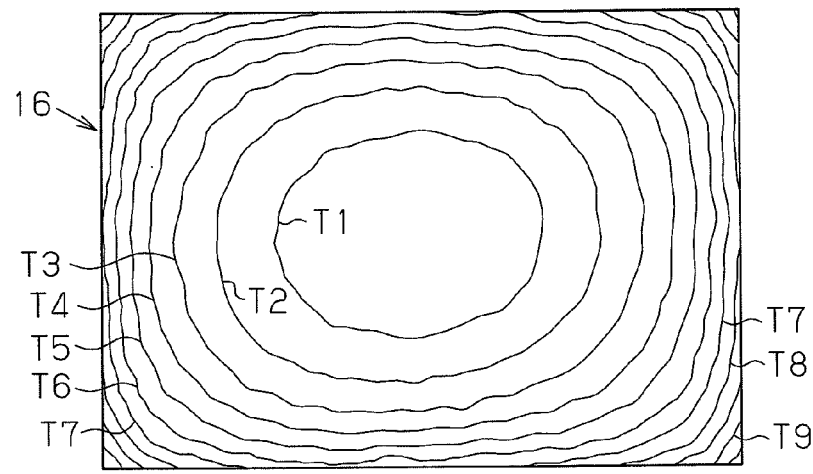
FIG. 3 is a diagram showing the temperature distribution of the semiconductor element shown in FIG. 1.
Figure 4A:
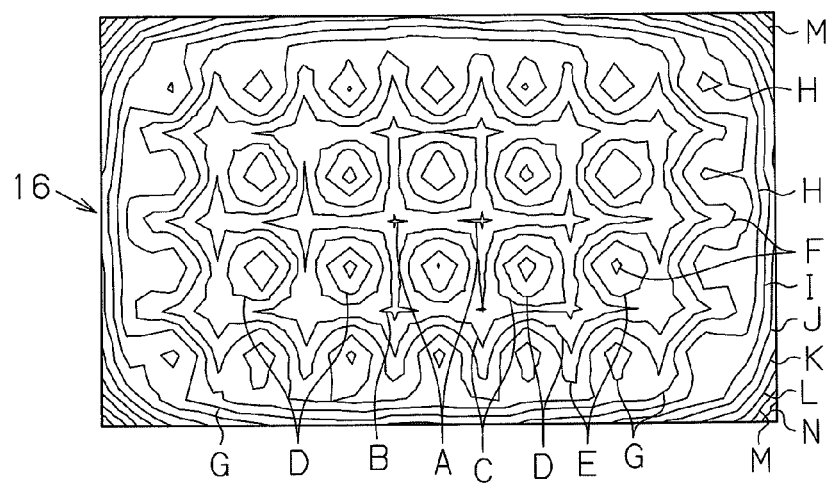
FIG. 4(a) is a diagram showing the temperature distribution of the semiconductor element with the heat mass of FIG. 1 mounted.
Figure 4B:
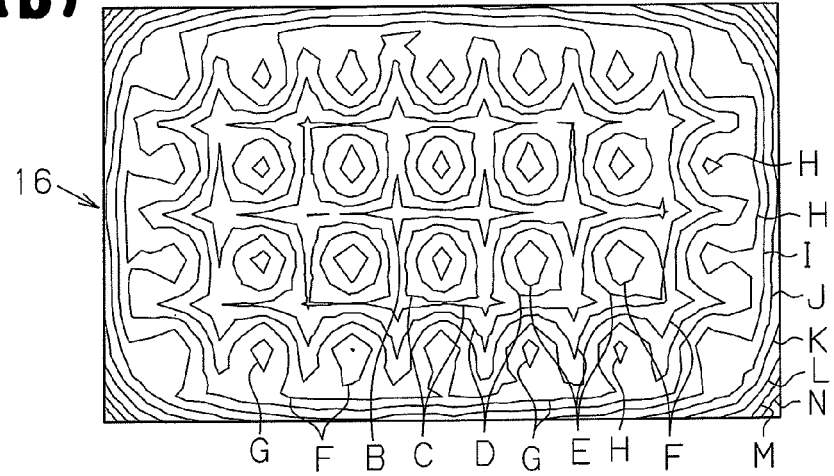
FIG. 4(b) is a diagram showing the temperature distribution of the semiconductor element with the heat mass of FIG. 5(a) mounted.
Figure 5A:
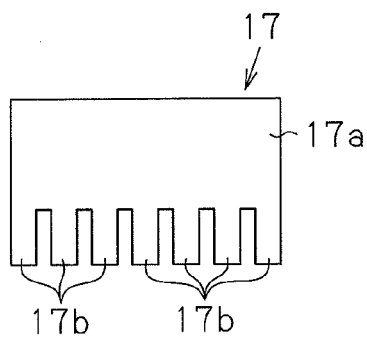
FIG. 5(a) is a diagram showing a heat mass having a rectangular parallelepiped main body.

Hereinafter, the "steady operation" of the semiconductor element 16 refers to a state in which the semiconductor 16 continually generated heat and was cooled by the cooler 11. FIG. 3 shows the temperature distribution of the semiconductor element 16 in the case where the semiconductor element 16 generated maximum heat after being in the steady operation at the temperature of 65° C., or 338.15 K. FIG. 3 shows the temperature distribution of the semiconductor element 16 in the case where no heat mass 17 was provided. FIG. 4(a) shows the temperature distribution of the semiconductor element 16 provided with the heat mass 17 of FIG. 1, in the case where the semiconductor element 16 generated maximum heat after being in the steady operation at the temperature of 65° C. For purpose of comparison, FIG. 4(b) shows the temperature distribution of a semiconductor element 16 provided with a heat mass 17 having a rectangular parallelepiped main body 17a and legs 17b of the same projecting lengths as shown in FIG. 5(a), in the same conditions as shown above.

The isothermal lines in FIG. 3, include line T1 representing 393.0 K, line T2 representing 390.0 K, line T3 representing 387.0 K, line T4 representing 384.0 K, and lines T5 to T9, which are separated at intervals of 3.0 K. The isothermal lines in FIGS. 4(a) and 4(b) include line A representing 376.3 K, line B representing 374.8 K, line C representing 373.3 K, line D representing 371.9 K, line E representing 370.4 K, line F representing 368.9 K, line G representing 367.5 K, line H representing 366.0 K, line I representing 364.6 K, line J representing 363.1 K, line K representing 361.6 K, line L representing 360.2 K, line M representing 358.7 K, and line N representing 357.2 K.

Figure 5B:
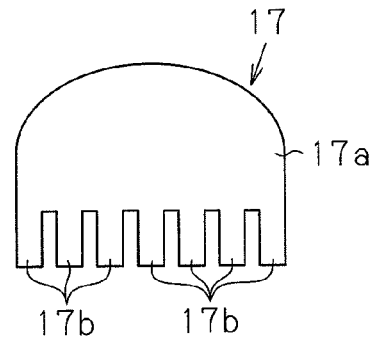
FIG. 5(b) is a diagram showing a heat mass having a dome-shaped main body.
Figure 6:
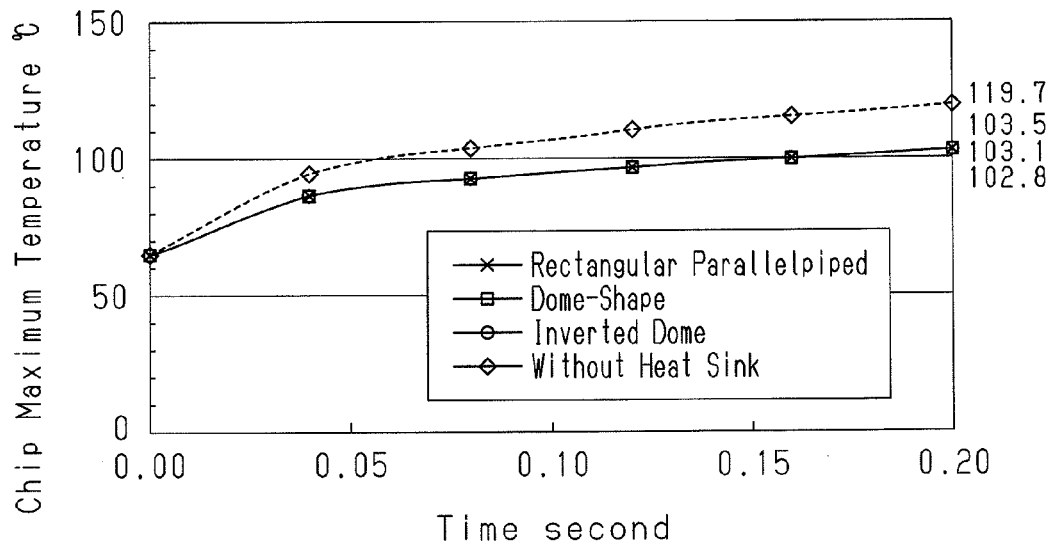
FIG. 6 is a graph showing changes with time in the highest temperature of a semiconductor element in cases where heat mass of various shapes are used and a case where no heat mass is used.

FIG. 6 shows changes over time of the highest temperatures (chip maximum temperature) of semiconductor elements 16 with heat masses 17 of different shapes in the case where, after operating steadily at 65° C., the semiconductor elements 16 received heat of 200 W for 0.2 seconds. For purpose of comparison, FIG. 6 also shows changes over time of the highest temperature of a semiconductor element 16 having no heat mass 17. In FIG. 6, sign ○ represents the highest temperature of the semiconductor element 16 connected to the heat mass 17 of the present embodiment, that is, the heat mass 17 having a dome shaped surface on which the legs 17b are provided. Sign x represents the highest temperature of a semiconductor element 16 joined to the heat mass 17 shown in FIG. 5(a) having a rectangular parallelepiped main body 17a. Sign □ represents the highest temperature of the semiconductor element 16 joined to the heat mass 17 shown in FIG. 5(b), that is, the heat mass 17 having a dome shaped surface on a surface opposite to the legs 17b. Sign ◇ represents the highest temperature of a semiconductor element 16 that was not joined to the heat mass 17. The volume of the main body 17a of the heat mass 17 of the present embodiment was less than that of the rectangular parallelepiped main body 17a shown in FIG. 5(a) by 24%.

As shown in FIG. 6, the highest temperature of the semiconductor element 16 that was not joined to the heat mass 17 was 119.7° C. On the other hand, the highest temperature of the semiconductor elements 16 connected to the heat mass 17 was substantially 103° C., although it slightly varied depending on the shape of the heat mass 17. That is, the highest temperature was lower than that of the semiconductor element 16 having no heat mass 17 by 16 to 17° C. Specifically, the highest temperature of the semiconductor element 16 was 103.5° C. when the heat mass 17 of the present embodiment was used, 102.8° C. when the heat mass 17 of FIG. 5(a) was used, and 103.1° C. when the heat mass 17 of FIG. 5(b) was used. As shown in FIGS. 4(a) and 4(b), although when the heat mass 17 of the present embodiment was used, the temperature of a central part of the semiconductor element 16 was higher than that in the case where the heat mass 17 of FIG. 5(a) was used, the overall temperature distribution was similar to the case of FIG. 5(a). However, the heat mass 17 used in the simulation, which is shown in FIG. 5(a), had legs 17b that were slightly shorter than the shortest one of the legs 17b of the heat mass 17 of the present embodiment, and a main body 17a the thickness of which was greater than the greatest thickness of the main body 17a of the heat mass 17 of the present embodiment. Taking these differences into consideration, the highest temperature and the temperature distribution of the semiconductor element 16 substantially remain the same regardless which one of the heat masses 17 shown in FIGS. 1, 5(a), and 5(b) is used.

The preferred embodiment has the following advantages.

(1) The semiconductor device 10 includes the semiconductor element 16, the cooler 11, and the heat mass 17. The cooler 11 is a forced-cooling cooler to which heat generated in the semiconductor element 16 is conducted. The heat mass 17 is joined to the semiconductor element 16 so as to be thermally coupled to the semiconductor element 16. Therefore, when the semiconductor element 16 generates heat that is greater than the heat generated in the steady heat generating state, the heat mass 17 temporarily absorbs part of the heat generated in the semiconductor element 16. Thus, even if the cooling capacity of the cooler 11 is insufficient, the semiconductor element 16 is inhibited from overheating.

(2) The heat mass 17 is formed such that the thermal resistance of a part of the heat mass 17 that corresponds to a high temperature part of the semiconductor element 16 in a heat generating state is lower than the thermal resistance of a part of the heat mass 17 that corresponds to a low temperature part of the semiconductor element 16. Therefore, compared to a case where the entire heat mass 17 is formed to correspond to a high temperature part of the semiconductor element 16, a heat mass having the equivalent cooling capacity can be formed using less amount of material.

(3) The heat mass 17 is formed such that the heat capacity of the part of the heat mass 17 that corresponds to the high temperature part of the semiconductor element 16 in a heat generating state is greater than the heat capacity of the part of the heat mass 17 that corresponds to the low temperature part of the semiconductor element 16. Therefore, the heat mass 17 absorbs a great amount of heat from the high temperature part of the semiconductor element 16, and less from the low temperature part.

(4) In the main body 17a of the heat mass 17, the thickness of the part of a large heat capacity is greater than the thickness of the part of a small heat capacity. Therefore, if the entire heat mass 17 is formed by the same material, the temperature distribution of the semiconductor element 16 is inhibited from being uneven.

(5) The heat mass 17 is directly joined to the semiconductor element 16 with the solder H, and the joint surface of the heat mass 17 and the semiconductor element 16 are divided into several segments. The stress acting on the solder H is therefore dispersed into several segments, so as to be reduced.

(6) When the semiconductor element 16 generates heat, the stress acting on the solder H due to the difference between the thermal expansion of the heat mass 17 and the thermal expansion of the semiconductor element 16 is relatively great in the vicinity of the periphery of the heat mass 17. However, since the lengths of the legs 17b located at the periphery of the heat mass 17 is longer than the lengths of the legs 17b at the central part of the heat mass 17, the stress due to the difference in the expansion rate is readily absorbed in the periphery of the heat mass 17, and the stress is reliably reduced.

(7) The surface of the heat mass 17 on which the legs 17b are formed is a curved surface, and the surface opposite to the curved surface is a flat surface. Therefore, even though the lengths of the legs 17b at the periphery of the heat mass 17 are longer than the lengths of the legs 17*b* at the central part of the heat mass 17, all the legs 17*b* can be joined to the semiconductor element 16.

Figure 7A:
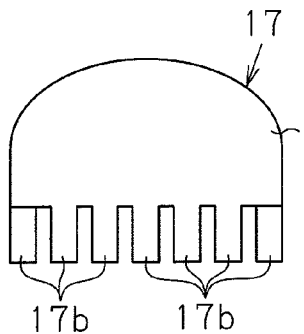
FIG. 7(a) is a front view showing a heat mass according to a second embodiment of the present invention.
Figure 7B:
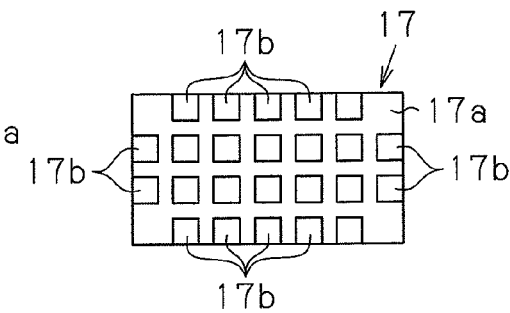
FIG. 7(b) is a schematic bottom view of the heat mass of FIG. 7(a)

FIGS. 7 and 8 show a second embodiment of the present invention. A heat mass 17 of the second embodiment corresponds to the heat mass 17 shown in FIG. 5(*b*) from which the legs 17*b* at the four corners of the main body 17*a* have been removed. Other configurations are basically the same as those of the heat mass 17 shown in FIG. 5(*b*), and explanations are omitted.

As shown in FIGS. 7(*a*) and 7(*b*), the heat mass 17 of the present invention has legs 17*b* and main body 17*a*. The surface of the main body 17*a* that is opposite to the legs 17*b* is formed into a dome-shape. No legs are formed in any of the four corners of the main body 17*a*.

The temperature distribution of the semiconductor element 16 in the case where no legs 17*b* are provided in the four corners of the main body 17*a*, and the semiconductor element 16 generates maximum heat from the steady operation of the temperature of 65° C., was obtained through simulation. The rectangular parallelepiped heat mass 17, not a dome shaped one, was used to facilitate the simulation. FIG. 8 shows the results of the simulation. In FIG. 8, isothermal lines that have the same signs as those in FIG. 4(*b*) represent the same temperatures as in FIG. 4(*b*).

When FIG. 8 and FIG. 4(*b*) are compared with each other, the temperature at the corners of the heat mass 17 with no legs 17*b* at the corners is higher than the temperature at the corners of the heat mass 17 having legs 17*b* at the corners shown in FIG. 5(*a*). However, the highest temperatures are substantially the same. The temperature at the corners of the semiconductor element 16 is lower than that at the central part. Thus, if the highest temperature of the central part of the semiconductor element 16 is only slightly different, it can be said that the heat mass 17 of FIG. 5(*a*) and the heat mass 17 formed by removing the corner legs 17*b* from the heat mass 17 of FIG. 5(*a*) have similar heat radiating capacity. Rather, since the use of the heat mass 17 without the four corner legs 17*b* reduces the temperature difference between the four corners and the central part of the semiconductor element 16, the unevenness of the temperature distribution is reduced. This lowers the possibility of the occurrence of hot spots. As illustrated in the simulation of the first embodiment, the heat masses 17 shown in FIGS. 1, 5(*a*), and 5(*b*) have substantially the same heat radiating performance. Thus, the heat masses 17 formed by removing the corner legs 17*b* from the heat masses 17 of FIGS. 1, 5(*a*), and 5(*b*) are expected to have substantially the same heat radiating performance.

The above described embodiments may be modified as follows.

In the heat mass 17, the shape of the surface of the main body 17*a* on which the legs 17*b* are formed may be changed as needed. For example, the surface of the main body 17*a* may be shaped as a truncated rectangular pyramid as shown in FIG. 9(*a*), a rectangular pyramid as shown in FIG. 9(*b*), or stepped rectangular pyramid as shown in FIG. 9(*c*). Even in these cases, since the surface of the main body 17*a* opposite to the legs 17*b* is flat, the same advantages as those of the above described heat masses 17 are obtained.

In the main body 17*a*, the surface opposite to the surface on which the legs 17*b* are formed does not need to be flat. For example, the surface of the main body 17*a* opposite to the surface on which the legs 17*b* are formed may be formed like a dome as shown in FIG. 10(*a*). Alternatively, the surface of the main body 17*a* on which the legs 17*b* are formed and the opposite surface may both be formed like a rectangular pyramid. Further, the main body 17*a* may have a flange portion 17*c* in a center with respect to the direction of its thickness as shown in FIG. 10(*c*).

The lengths of the legs 17*b* at the periphery of the heat mass 17 do not need to be longer than the legs 17*b* in the central part of the heat mass 17, but all the legs 17*b* may have the same length. In this case, for example, as shown in FIGS. 11(*a*) to 11(*e*), the main body 17*a* of the heat mass 17 may be shaped as a dome, a combination of a rectangular prism and a rectangular pyramid, a rectangular pyramid, a stepped rectangular pyramid, or a truncated rectangular pyramid. In these cases, when the heat mass 17 is joined to the semiconductor element 16, a plurality of legs 17*b* exist between the main body 17*a* and the semiconductor element 16, which divides the area in which the heat mass 17 contacts the semiconductor element 16 into several segments. Accordingly, the stress acting on the solder H is dispersed and lessened.

The heat mass 17 may have no legs 17*b*. For example, a heat mass 17 having the same shape as any of the main bodies 17*a* shown in FIGS. 11(*a*) to 11(*e*) may be directly joined to the semiconductor element 16 by solder. In this case, since the contact area between the heat mass 17 and the semiconductor element 16 is not divided into several segments, the stress acting on the solder H is not dispersed into several segments. However, the heat mass 17 absorbs a great amount of heat at parts that correspond to high temperature parts of the semiconductor element 16 in the heat generating state, and absorbs less heat at parts that correspond to the low temperature parts of the semiconductor element 16. Therefore, compared to a case where the entire heat mass 17 is formed to correspond to a high temperature part of the semiconductor element 16, a heat mass 17 having the equivalent capacity can be formed using less amount of material.

In the case where the heat mass 17 is used with a semiconductor element 16 in which the temperature is high in the central part and low in the periphery in the heat generating state, the heat mass 17 shown in FIG. 7 does not necessarily need to be used. For example, heat masses 17 obtained by removing the four corner legs 17*b* from the heat masses 17 having a main body 17*a* of a rectangular parallelepiped or other shapes shown in the drawings may be used.

In each of the above described embodiments, the planar shape of the heat mass 17 is rectangular in accordance with the planar shape of the semiconductor element 16. However, the shape of the heat mass 17 may be changed. For example, as shown in FIGS. 12(*a*) to 12(*f*), the planar shape of the heat mass 17 may be changed to an ellipse, a rectangular with four corners rounded to protrude outward, a rectangular with four concave corners, a rectangular with chamfered four corners, a rectangular with four corners with rectangular pieces removed, or a rhombus.

The shape of the heat mass 17 is not limited to any of those shown above. In short, the heat mass 17 may have any shape as long as the heat capacity of parts of the heat mass 17 that correspond to high temperature parts of the semiconductor element 16 is greater than the heat capacity of parts of the heat mass 17 that correspond to low temperature parts of the semiconductor element 16. For example, as shown FIG. 13(*a*), the heat mass 17 may have a main body 17*a* that includes plate portion 18*a* and a plurality of rod portions 18*b*. The rod portions 18*b* extend from the upper surface of the plate portion 18*a* and in a direction away from the semiconductor element 16. The length of the rod portions 18*b* located in a central part of the plate portion 18*a* is longer than the length of the rod portions 18*b* located at the periphery of the plate portion 18*a*. Alternatively, as shown in FIG. 13(*b*), the heat mass 17 may be formed only by rod portions 18*b* of different lengths. Longer rod portions 18b have a large heat capacity, and shorter rod portions 18b have a small heat capacity.

In the case where the temperature of the semiconductor element 16 in the heat generating state is highest at the edges and gradually decreases toward the central part, a heat masses 17 shown in FIGS. 14(a) and 14(b) may be used. The heat mass 17 shown in FIG. 14(a) only includes a plurality of rod portions 18b. The length of the rod portions 18b at the edges of the semiconductor element 16 are long, and the lengths of the rod portions 18b continuously decreases toward the center of the semiconductor element 16. The heat mass 17 shown in FIG. 14(b) is thick at the edges and becomes thinner toward the central part.

In the case where the temperature of the semiconductor element 16 in the heat generating state is highest at one end (first end) and gradually decreases toward the other end (second end), a heat masses 17 shown in FIGS. 14(c) and 14(d) may be used. The heat mass 17 shown in FIG. 14(c) only includes a plurality of rod portions 18b. The length of the rod portions 18b at the first end is long, and the lengths of the rod portions 18b continuously decreases toward the second end. The heat mass 17 of FIG. 14(d) is thickest at a part corresponding to the first end, and gradually becomes thinner toward the second end.

The heat mass 17 may be configured such that the thickness (length) of the heat mass 17 in a large heat capacity part is equal to the thickness (length) of the heat mass 17 in a small heat capacity part. For example, as shown in FIG. 14(e), the heat mass 17 may be formed by a plurality of rod portions 18b. In this case, rod portions 18b in a large heat capacity part of the heat mass 17 have a greater specific heat per unit volume than rod portions 18b in a small heat capacity part. For example, the specific heat per unit mass [J/(kg·° C.)] at 20° C., the thermal conductivity [W/(m·K)], the density [g/cm³], and the specific heat per unit volume [J/(cm³·° C.)], which is obtained based on the specific heat per unit mass and the density of metals that can used as the material for the rod portions 18b are exemplified in the following table.

TABLE 1

| Material | Specific Heat per Unit Mass [J/(kg · ° C.)] | Thermal Conductivity [W/(m · K)] | Density [g/cm³] | Specific Heat per Unit Volume [J/(cm³ · C.°)] |
| --- | --- | --- | --- | --- |
| Aluminum | 900 | 204 | 2.70 | 2.4 |
| Silver | 234 | 418 | 10.5 | 2.5 |
| Carbon Steel | 461 | 45 | 7.87 | 3.6 |
| Copper | 419 | 372 | 8.92 | 3.7 |
| Lead | 130 | 35 | 11.3 | 1.5 |

Therefore, rod portions 18b that correspond to a large heat capacity part of the heat mass 17 (for example, a part that corresponds to the central part of the semiconductor element 16) are formed of iron (carbon steel) or copper, and rod portions 18b that correspond to a small heat capacity part (for example, parts that correspond to the periphery of the semiconductor element 16) are formed of aluminum. In this case, even if the heat mass 17 have rod portions 18b of the same length, the rod portions 18b have different heat capacities that correspond to the temperature distribution of the semiconductor element 16 in the heat generating state. Particularly, if the rod portions 18b that correspond to the high temperature portion of the semiconductor element 16 are made of copper, the heat generated in the high temperature part of the semiconductor element 16 is efficiently removed.

In the case where the heat mass 17 is formed only by rod portions 18b as in the cases of FIGS. 14(a), 14(c), and 14(e), the stress acting on the solder H due to expansion and contraction of the heat mass 17 is less than that in the case where the heat mass 17 is integrally formed as one part.

As long as the heat capacity of the heat mass 17 changes at least in two steps, the heat capacity does not need to change in three or more, steps or change continuously.

Figure 15A:
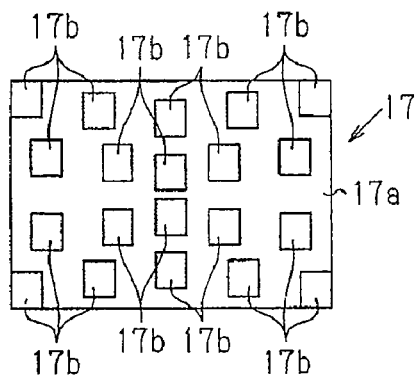
FIG. 15(a) is a bottom view showing a heat mass of a modification.

The legs 17b do not need to be evenly distributed over the entire surface of a surface of the main body 17a. Legs 17b may be densely arranged in a part of the heat mass 17 that corresponds to a high temperature part of the semiconductor element 16 in the heat generating state. For example, in the case where the temperature of the semiconductor element 16 in the heat generating state is high in the central part, legs 17b are densely arranged in a part of the heat mass 17 that corresponds to the central part of the semiconductor element 16 as shown in FIG. 15(a).

Figure 15B:
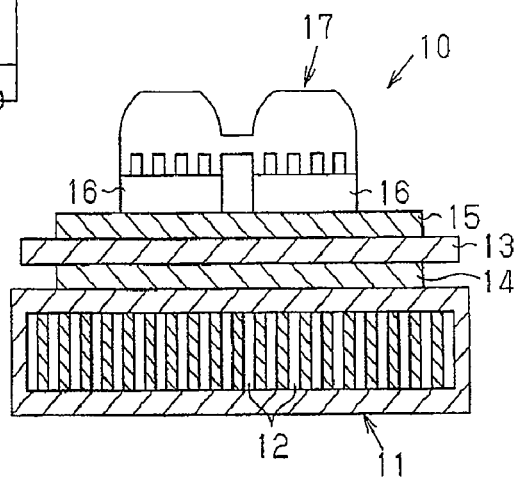
FIG. 15(b) is a diagram showing a semiconductor device of a modification.
Figure 16A:
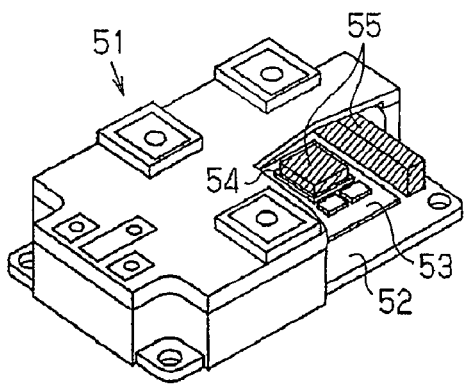
FIG. 16(a) is a perspective view showing a prior art semiconductor device.
Figure 16B:
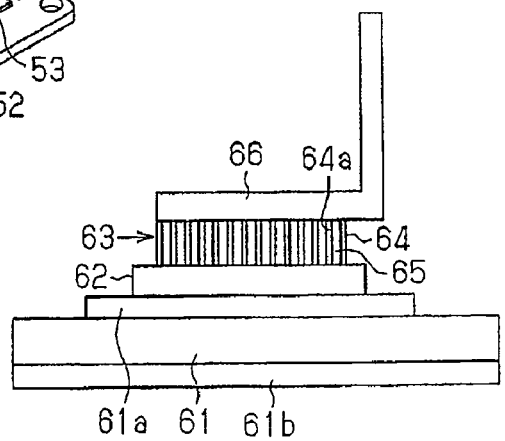
FIG. 16(b) is a side view showing another prior art semiconductor device.

The heat mass 17 may be arranged to straddle two or more semiconductor elements 16. For example, as shown in FIG. 15(b), in the case where two semiconductor elements 16 are soldered to a metal wiring layer 15, a single heat mass 17 may be provided such that the heat mass 17 straddles the two semiconductor elements 16. The heat mass 17 may have legs 17b or no legs 17b.

In the case where a heat mass 17 having no legs 17b is soldered to a semiconductor element 16, the heat mass 17 does not need to be joined to the semiconductor element 16 with solder in the entire area of the surface of the heat mass 17 that faces the semiconductor element 16. The heat mass 17 may be joined to the semiconductor element 16 with solder at several spots on a surface of the heat mass 17 that faces the semiconductor element 16.

The heat mass 17 may function as an electrode of the semiconductor element 16.

The materials for the metal wiring layer 15 and the heat mass 17 are not limited to aluminum and aluminum alloys, but may be copper, copper alloys, or silver. However, for reducing the weight, it is preferable to use aluminum or an aluminum alloy.

The material for the ceramic substrate 13 is not limited to aluminum nitride, but may be silicon nitride, or alumina.

The cooling medium flowing through the cooling medium passages 12 does not need to be water as long as the cooler 11 is a forcibly cooling type. For example, liquid other than water or gas such as air may be used. The cooler 11 may be an ebullient cooling type.

The metal layer 14 located between the ceramic substrate 13 and the cooler 11 may be omitted. That is, the cooler 11 may be directly joined to the ceramic substrate 13.

The semiconductor device 10 does not need to be installed on vehicles but may be applied to other uses.

The invention claimed is:

1. A vehicle mount semiconductor device comprising:
   a semiconductor element;
   a forced-cooling type cooler to which heat generated in the semiconductor element is conducted; and
   a heat mass that is joined onto a first side of the semiconductor element, so as to be thermally coupled to the semiconductor element,
   wherein the forced-cooling type cooler is provided on a second side of the semiconductor element, the heat mass is formed such that the thermal resistance of a part of the heat mass that corresponds to a high temperature part of the semiconductor element in a heat generating state is lower than the thermal resistance of a part of the heat mass that corresponds to a low temperature part of the semiconductor element, the heat mass has a plurality of projections, each projection has a distal end that is joined to the semiconductor element with solder, and the length of projections that are located in a peripheral portion of the heat mass is greater than the length of the other projections.

2. The semiconductor device according to claim 1, wherein the heat mass is formed such that the heat capacity of the part that corresponds to the high temperature part of the semiconductor element is greater than the heat capacity of the part that corresponds to the low temperature part of the semiconductor element.

3. The semiconductor device according to claim 2, wherein the thickness of the heat mass is greater in the part of a great heat capacity than in the part of a small heat capacity.

4. The semiconductor device according to claim 2, wherein the heat mass has a main body and the plurality of projections extend from the main body, and wherein the thickness of the main body is greater in the part of a great heat capacity than in the part of a small heat capacity.

5. The semiconductor device according to claim 1,
wherein the planar shape of the semiconductor element is rectangular,
wherein, when in a heat generating state, the temperature of the semiconductor element is high in a central part thereof, and
wherein the planar shape of the heat mass is rectangular, and wherein the heat mass is joined to the semiconductor element at a part except for the four corners.

6. The semiconductor device according to claim 1, wherein the semiconductor element is one of a plurality of semiconductor elements, the semiconductor elements being joined onto the single heat mass.

* * * * *